(12) United States Patent
Kurihara

(10) Patent No.: US 7,476,016 B2
(45) Date of Patent: Jan. 13, 2009

(54) ILLUMINATING DEVICE AND DISPLAY DEVICE INCLUDING THE SAME

(75) Inventor: Makoto Kurihara, Chiba (JP)

(73) Assignee: Seiko Instruments Inc. (JP)

( * ) Notice: Subject to any disclaimer, the term of this patent is extended or adjusted under 35 U.S.C. 154(b) by 221 days.

(21) Appl. No.: 11/439,901

(22) Filed: May 24, 2006

(65) Prior Publication Data

US 2006/0289880 A1    Dec. 28, 2006

(30) Foreign Application Priority Data

Jun. 28, 2005  (JP) ............................. 2005-188752
Aug. 1, 2005   (JP) ............................. 2005-222400

(51) Int. Cl.
*F21V 7/04* (2006.01)
(52) U.S. Cl. ................. 362/612; 362/231; 362/251; 362/276; 362/555; 362/613
(58) Field of Classification Search ............... 362/231, 362/251, 276, 295, 394, 555.561, 612, 613, 362/631
See application file for complete search history.

(56) References Cited

U.S. PATENT DOCUMENTS

| | | | |
|---|---|---|---|
| 7,204,607 B2 * | 4/2007 | Yano et al. .................. 362/231 |
| 7,207,706 B2 * | 4/2007 | Leu et al. .................... 362/612 |
| 2005/0117334 A1 * | 6/2005 | Lee et al. .................... 362/231 |
| 2006/0082679 A1 * | 4/2006 | Chua et al. .................. 348/371 |
| 2006/0146563 A1 * | 7/2006 | Chen .......................... 362/561 |

* cited by examiner

*Primary Examiner*—Stephen F Husar
(74) *Attorney, Agent, or Firm*—Adams & Wilks

(57) ABSTRACT

Provided is a display device including: a light guide member for mixing light from a blue LED element coated with a translucent resin mixed with phosphor particles which converts blue light into green light with light from a red LED element to make white light exit from a light exit surface; and a non-self light emission display element provided on an irradiating surface side of the light guide member. Therefore, the display element is irradiated with white light whose sufficient wavelength region is 600 nm or more and whose intensity efficiency is high. When the display device further includes a circuit for separately controlling light emission intensities of the red LED element and a blue LED element, chromatic balance can be adjusted even after manufacturing and an intensity of the display device and color reproducibility thereof can be easily set in an optimum range even after assembly.

20 Claims, 4 Drawing Sheets

ILLUMINATING DEVICE AND DISPLAY DEVICE INCLUDING THE SAME

BACKGROUND OF THE INVENTION

1. Field of the Invention

The present invention relates to an illuminating device for illuminating non-self light emission display elements and a display device used for electronic devices. In particular, the present invention relates to a liquid crystal display device used for a portable information device, a mobile telephone, and the like and an illuminating device used as a frontlight unit or a backlight unit to illuminate elements.

2. Description of the Related Art

In recent years, most of display devices used for a mobile telephone, a mobile computer, and the like are liquid crystal display devices capable of obtaining a high-definition color image with reduced power consumption. A liquid crystal element used for the liquid crystal display device is a non-self light emission type, so the liquid crystal element is illuminated by an illuminating device using a high-intensity white LED as a light source.

In particular, used for the mobile telephone is a reflection type liquid crystal display device, which has a large aperture and delivers bright images, or a liquid crystal display device of a double side visible type, which can display image information on both front and rear screens. The white LED used to illuminate a display element of each of the liquid crystal display devices has a structure in which a resin into which a green phosphor or a yellow phosphor is dispersed is provided immediately in front of a light emitting surface of a blue LED made of InGaN, GaN, or the like. According to the structure, green light or yellow light can be mixed with original blue light to obtain white light. An yttrium aluminum garnet (YAG) phosphor in which YAG is doped with a rare-earth element has been widely known as a phosphor for converting the blue light into the yellow light. In addition, a chalcogenide phosphor doped with a rare-earth element has been widely known as a phosphor for converting the blue light into the green light or red light with relatively high efficiency. For example, disclosed in JP 11-121802 A is an LED display device in which a plurality of light emitting elements, each of which emits light having a wavelength equal to or shorter than the wavelength of the blue light, are arranged on a printed circuit board having an arbitrary shape and an arbitrary area in which circuits are formed and the respective light emitting elements are coated with a translucent resin containing a wavelength conversion material.

However, in the case of additive mixture of two colors using the blue LED and the YAG phosphor (pseudo white LED), the amount of light component having a wavelength region of 600 nm or more is small. Therefore, the realization of an LCD module having high color reproducibility is inhibited. In general, when the pseudo white LED is used as a light source, it is very difficult to exceed an NTSC ratio of 100% with a current color filter technique.

On the other hand, when additive mixture of three colors using two kinds of phosphors for converting blue light into green light and red light, respectively, based on blue excitation and the blue LED (three-wavelength white LED) is used, the LCD module having high color reproducibility can be realized. However, it is the fact that a material having very high efficiency is not found as a phosphor for emitting red light based on the blue excitation. Therefore, the intensity efficiency obtained by the structure is much lower than the efficiency of the pseudo white LED and is only approximately half. Further, a chromatic variation of the three-wavelength white LED is very large, so the color balance cannot be adjusted after the assembly of an LED package. Thus, even when respective products (display devices) are composed of display panels, each of which has the same specification, it is impossible to avoid the occurrence of a chromatic difference between the respective products.

SUMMARY OF THE INVENTION

An object of the present invention is to provide a light source for a display device, which includes a sufficient wavelength region of 600 nm or more, has intensity efficiency equal to or larger than that of a pseudo white LED, and can adjust chromatic balance even after manufacturing.

A phosphor for emitting red light -based on blue excitation has low intensity efficiency. On the other hand, an example of a phosphor for converting blue light into green light based on blue excitation includes a phosphor which is composed of II-group metal thiogallate and a rare-earth dopant and has intensity efficiency equal to or larger than that of a YAG phosphor. An example of a light source for emitting red light includes a red LED element made of GaP, GaAlAs, AlGaInP, or the like. In the case of a light source for obtaining blue-green light, a blue LED element is mounted by wire bonding to an electrode on a circuit board on which electrical wirings are formed. Then, the blue LED element is completely-coated with a non-permeable transparent resin which is translucent and mixed with the high-efficient phosphor particles for converting light emitted from the blue LED element into green light. The light emitted from the blue LED element and the light converted by the phosphor particles are subjected to additive color mixture to obtain the blue-green light. When the red LED element made of GaP, GaAlAs, AlGaInP, or the like is further mounted on the circuit board and turned on, it is possible to emit all light beams of three primary colors of red (R), green (G), and Blue (B). A circuit structure capable of controlling light emission intensities of a red LED and a blue-green LED is used.

Light from the light source having the above-mentioned structure is incident on an LCD having a color filter tuned for three wavelengths through a light guide member.

DETAILED DESCRIPTION OF THE PREFERRED EMBODIMENT

Figure 1:
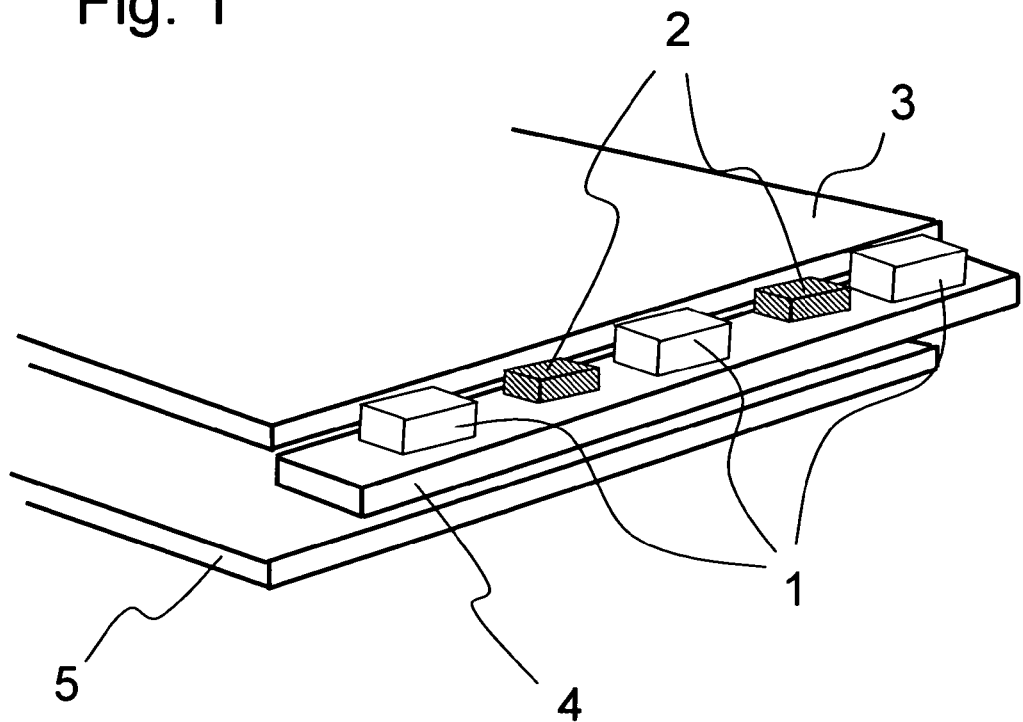
FIG. 1 is a schematic perspective view showing a structure of a light source section of an illuminating device according to the present invention.

A display device according to the present invention includes: a blue-green light emitting diode package including a blue LED element to which a resin into which phosphor particles are dispersed is potted; a red light emitting diode package including a red LED element; a circuit board on which the red light emitting diode package and the blue-green light emitting diode package are separately arranged; light guide member opposed to the circuit board, for mixing blue-green light from the blue-green light emitting diode package with red light from the red light emitting diode package to make white light exit from a light exit surface of the light guide member; and a non-self light emission display element provided on a light exit surface side of the light guide member.

When the display device further includes a circuit for controlling light emission intensities of the red LED element and the blue LED element, the light emission intensities of the red LED element and the blue LED element can be controlled based on color balance of a color filter included in the display element. Therefore, a liquid crystal display device whose intensity is very high and color reproducibility is high can be realized. That is, an intensity and achromatic level are measured after the completion of the liquid crystal display device. Then, the light emission intensities of the red LED and the blue-green LED are adjusted based on a result obtained by measurement. Therefore, it is possible to easily provide a liquid crystal display device having preferable white balance.

The circuit for controlling the light emission intensities is divided into a driver circuit for the red LED element and a driver circuit for the blue LED element. The driver circuit for the red LED element includes a temperature-sensitive resistor. The driver circuit for the blue LED element includes a current detecting resistor. The temperature-sensitive resistor has a characteristic in which a resistance value thereof is changed based on temperature. When the temperature-sensitive resistor is adjusted so as to flow a current closer to a suitable current into the red LED, color variation due to temperature can be eliminated. A value of current flowing through the blue-green LED is constantly detected using the current detecting resistor. A value of current flowing through the red LED is controlled corresponding to the detected current value. According to the above-mentioned structure, it is unnecessary to convert an intensity adjustment signal for logic from a CPU of an application on which a display device is mounted into an analog signal, so a simple circuit structure can be realized.

Furthermore, a display device according to the present invention includes: a blue LED element for emitting a blue light; a phosphor for converting the blue light into a green light having a peek wavelength in a green spectral region; a red LED element for emitting a red light; a display element of a non-self light emission type having a color filter, the display element is illuminated by the blue light, the green light and the red light; and a circuit for controlling light emission intensities of the red LED element and the blue LED element according to color balance of the color filter so that the display device can get preferable white balance. So, the light emission intensities of the red LED element and the blue LED element are adjusted according to color balance of the color filter. Therefore, it is possible to easily provide a liquid crystal display device having preferable white balance.

The blue LED element is made of a material of InGaN or GaN. The red LED element is made of a material of GaP, GaAlAs, or AlGaInP. The phosphor particles are made of a material including at least one of $SrGa_2S_4$:Eu, $Ca_3Sc_2Si_3O_{12}$:Ce, and Sr—SION:Eu. A non-permeable material is used as the resin.

An example of non-permeable material can include silicon resin, cycloolefin resin, fluorine resin, and epoxy resin.

An illuminating device according to the present invention includes: a blue-green light emitting diode package including a blue LED element to which a resin into which phosphor particles are dispersed is potted; a red light emitting diode package including a red LED element; a circuit board on which the red-light emitting diode package and the blue-green light emitting diode package are separately arranged; and a light guide member which is located opposite and adjacent to the circuit board. With such a structure, blue-green light and red light are mixed in the light guide member, thereby obtaining white light. A non-permeable material is used as the resin, so that the reliability of the package is improved.

Embodiment 1

FIG. 1 schematically shows an outline of an illuminating device according to this embodiment. As shown in FIG. 1, blue-green LEDs (blue-green LED packages) 1 and red LEDs (red LED packages) 2 are mounted on a terminal portion of a circuit board 4 through solder. A material of each of the red LEDs 2 can be selected from GaP, GaAlAs, and AlGaInP to obtain an optimum wavelength and intensity. Each of the blue-green LEDs 1 emits light having a spectrum whose two peaks are caused in a wavelength of 450 nm to 480 nm and wavelength of 520 nm to 550 nm. The light emitted from each of the red LEDs has a peak in a wavelength of 600 nm or more. The light emitted from the blue-green LED 1 and the light emitted from the red LED 2 are mixed with each other by reflection and refraction which are repeated between a light guide member 3 and a reflecting plate 5, so that the resultant light becomes white light. Light emission intensities of the red LED 2 and the blue-green LED 1 can be controlled based on current values. Therefore, even after the illuminating device is assembled as a backlight unit, white balance can be adjusted. A flexible printed board or a glass epoxy board can be used as the circuit board 4. Polycarbonate, aclylic, or the like can be used as a material of the light guide member 3. Silver or aluminum can be used for the reflecting plate 5.

Figure 2:
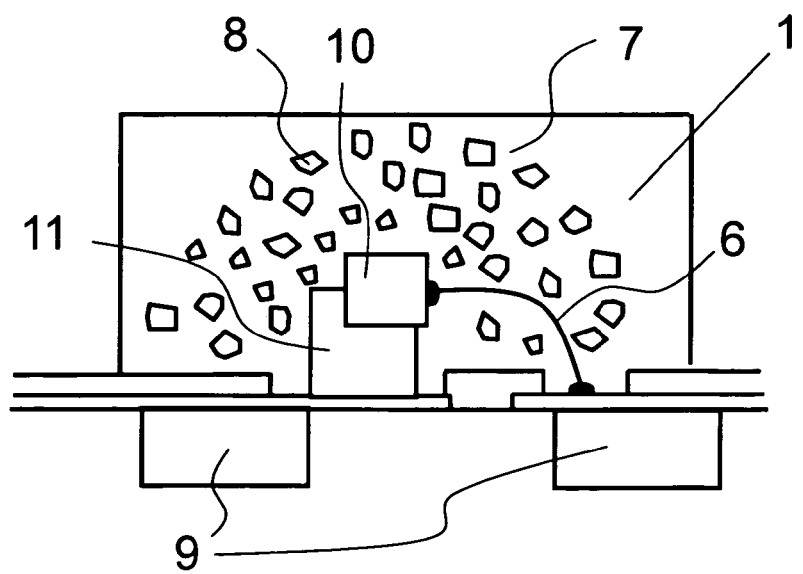
FIG. 2 is a schematic cross sectional view showing the structure of the light source section of the illuminating device according to the present invention.

FIG. 2 is a schematic cross sectional view showing a structure of the blue-green LED 1. A conductive base 11 is electrically connected with an electrical wiring through a conductive paste, solder, or the like. A blue LED element 10 made of InGaN or GaN is electrically bonded to the conductive base 11 through the conductive paste. The conductive base 11 is used to increase the degree of electrical connection between the blue LED element 10 and the electrical wiring, improve thermal conductivity, or adjust a height from the circuit board 4. In an environment in which those conditions are satisfied, the conductive base 11 is not necessarily provided. Two electrodes for current injection (not shown) are formed in the blue LED element 10. One of the electrodes is electrically connected with a first electrical wiring through a wire 6 and the other electrode is electrically connected with a second electrical wiring through the conductive base 11. When the conductive base 11 is not used, each of the electrodes is electrically connected with a corresponding electrical wiring through the wire 6. For example, a gold wire for normal wire bonding can be used as the wire 6. In any case, the respective electrical wirings are electrically connected with electrodes 9 provided for connection to the board.

The blue LED element 10, the entire conductive base 11, and a part of or the entire wire 6 are coated or encapsulated with a non-permeable material 7 which is translucent to form a blue-green light emitting diode package. The non-permeable material 7 contains phosphor particles 8 mixed at a predetermined concentration. A polymer material such as a silicon resin, a cycloolefin resin, or a fluorine resin can be used as the non-permeable material 7. Any one selected from those resins may be used or a hybrid composed of a plurality of resins may be used. The non-permeable material is not necessarily transparent and only needs to be translucent. An epoxy material is widely used. A YAG phosphor microparticle containing a rare-earth element or a chalcogenide compound phosphor particle can be used as the phosphor particle 8. In particular, a phosphor material composed of II-group metal thiogallate and a rare-earth dopant has high optical conversion efficiency. Therefore, this embodiment is based on the use of $SrGa_2S_4$:Eu. In addition, $Ca_3Sc_2Si_3O_{12}$:Ce or Sr—SION:Eu can be also used as the phosphor particle 8.

When the non-permeable material 7 is mixed with the phosphor particle 8 at a predetermined ratio and the LED 1 shown in FIG. 2 is coated therewith, green light generated by wavelength conversion on the blue light from the blue LED element 10 made of InGaN or GaN and the blue light are subjected to additive color mixture, so that it is possible to obtain a light emission color having target chromaticity. A color reproducibility region caused by the light emission color can be arbitrarily controlled by adjusting a mixing concentration of the phosphor particle 8, an average diameter of each of the phosphor particles, and an intensity of the blue light for irradiation.

Figure 5:
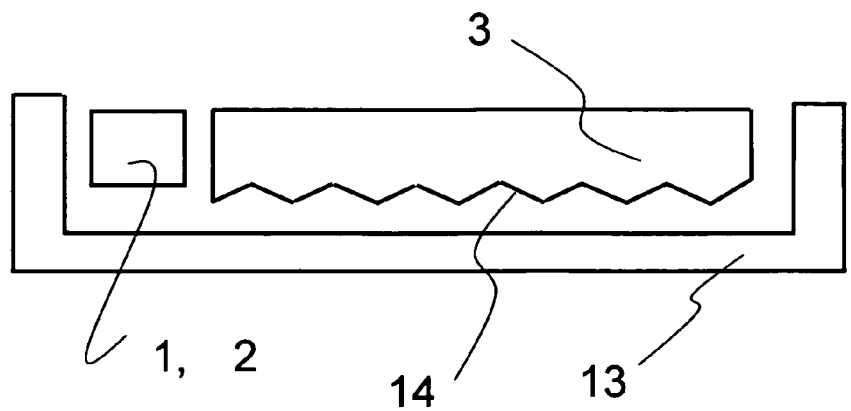
FIG. 5 is a schematic cross sectional view showing the entire structure of the illuminating device according to the present invention.

FIG. 5 schematically shows the entire structure of the illuminating apparatus according to the present invention. The blue-green LED 1 and the red LED 2 are simultaneously turned on to allow light beams therefrom to enter the light guide member 3. The incident light beams uniformly travel to an upper portion of the cross sectional drawing by a prism 14 designed to have an optimum angle and an optimum height. When an additional prism is disposed in a light incident portion, the degree of mixture between the red and the blue-green is improved in an inner portion of the light guide member. The light guide member and the light source are housed in a frame 13.

Figure 3:
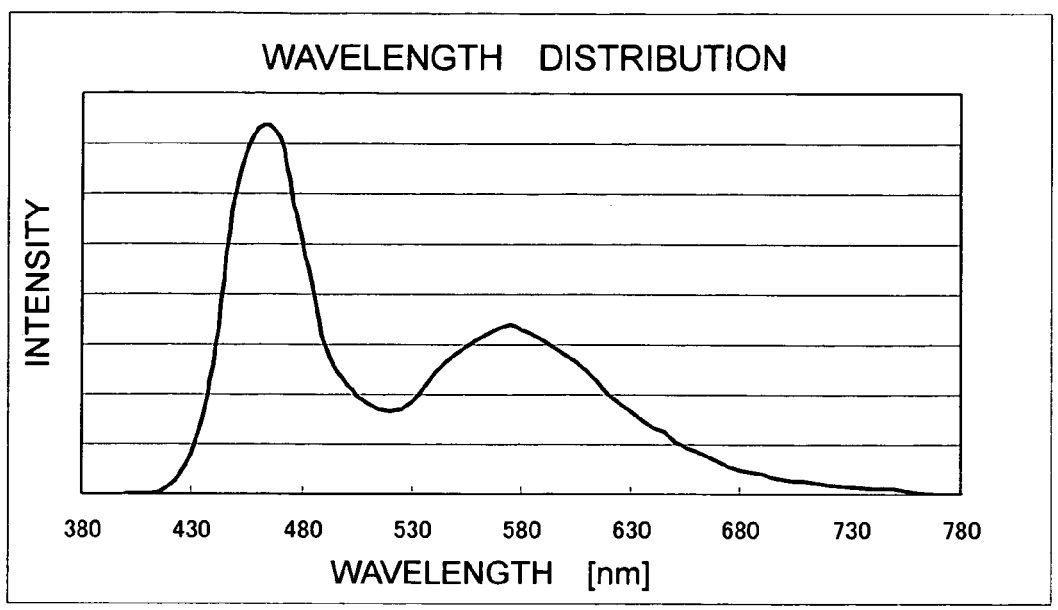
FIG. 3 is a graph showing a spectrum of a conventional illuminating device.
Figure 4:
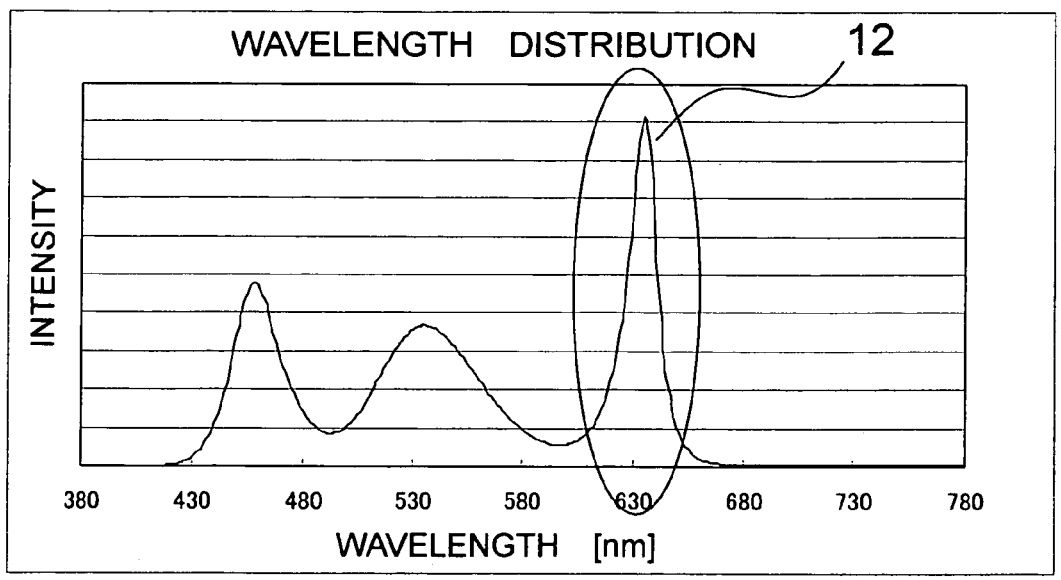
FIG. 4 is a graph showing a spectrum of the illuminating device according to the present invention.

FIG. 3 shows a light emission spectrum of a conventional illuminating device using a two-wavelength type pseudo white LED. A wavelength region of a red component is 600 nm or more. An intensity of the red component is extremely smaller than that of each of a blue component and a green component. FIG. 4 shows a light emission spectrum of the illuminating device having the above-mentioned structure. It is apparent that an intensity of a red light emitting region 12 of 600 nm or more is much higher than the intensity of the red component as shown in FIG. 3.

Embodiment 2

Figure 6:
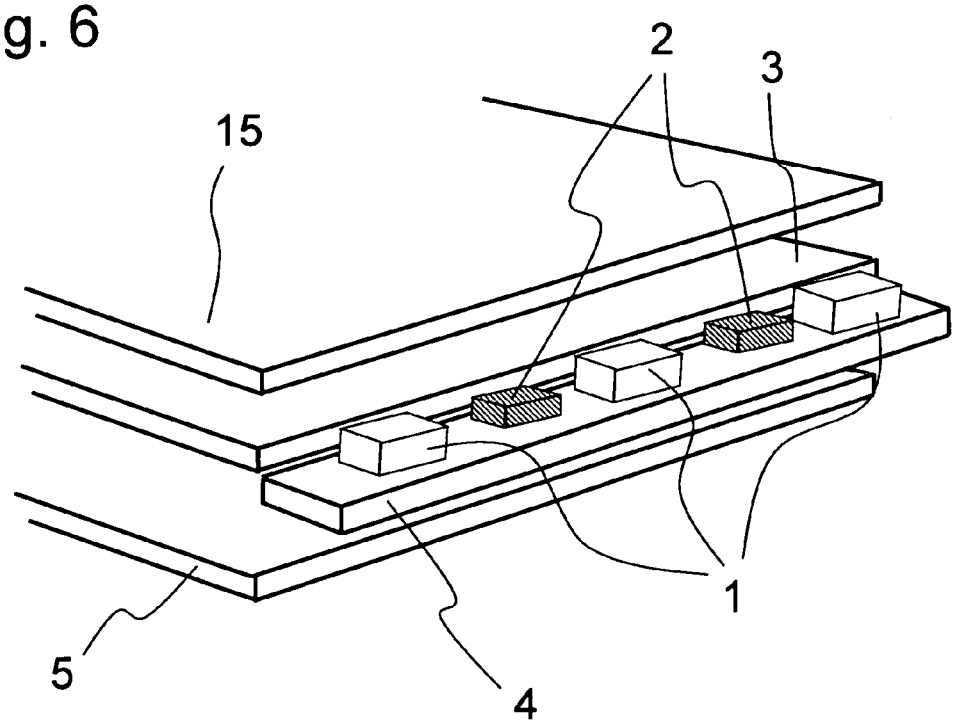
FIG. 6 is a schematic perspective view showing a structure of a liquid crystal display device according to the present invention.

FIG. 6 is a schematic perspective view showing a structure of a liquid crystal display device according to the present invention. An LCD panel 15 having a color filter subjected to color tuning based on the light emission spectrum shown in FIG. 4 is disposed on a light emitting surface of the illuminating device, thereby constructing a liquid crystal display device whose intensity is very high and color reproducibility is high. An intensity adjusting circuit capable of controlling the light emission intensities of the red LED 2 and the blue-green LED 1 is further mounted. Therefore, by measuring intensity and a chromatic level after the completion of an LCD module and adjusting the light emission intensities of the red LED 2 and the blue-green LED 1, an LCD module having arbitrary white balance can be provided.

Figure 7:
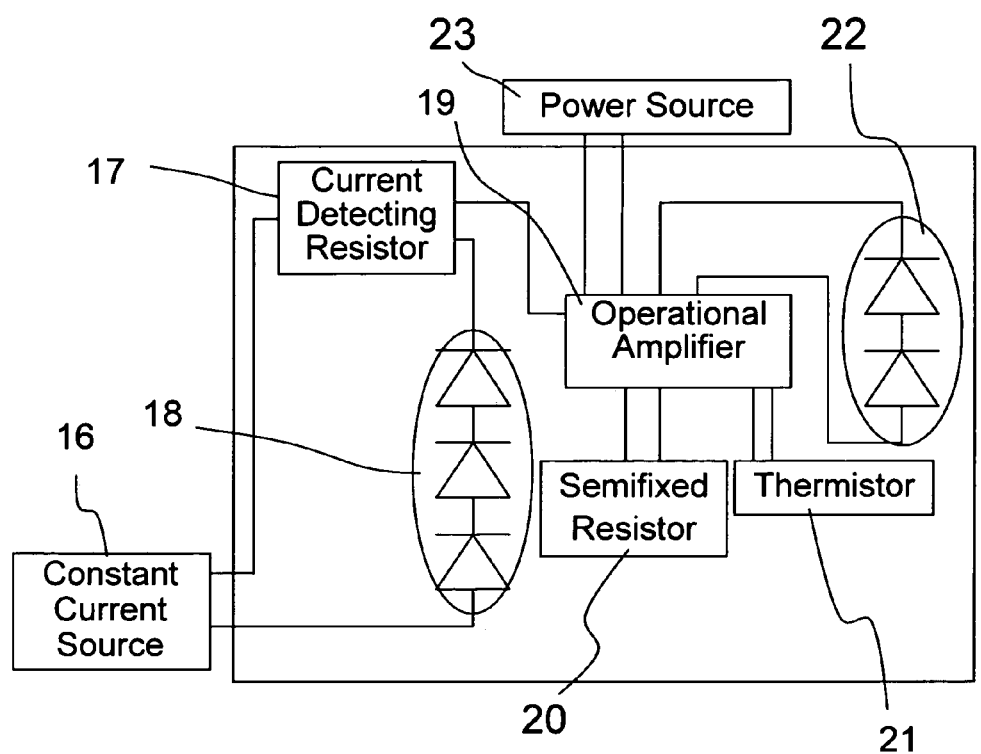
FIG. 7 is a schematic block diagram showing a circuit structure of the illuminating device according to the present invention.

FIG. 7 is a schematic block diagram showing a circuit structure of the illuminating device used for a display device according to the present invention. A current is supplied from a constant current source 16 to a blue-green LED 18 to turn on the blue-green LED 18. A power source 23 is, for example, a battery made of lithium or the like. A constant current for turning on a red LED 22 is produced by an operational amplifier 19. An LED driver may be used instead of the operational amplifier 19. Light emitting diodes and the LCD panel each have a specific variation in intensity. Therefore, when a current value ratio between the blue-green LED 18 and the red LED 22 is set to a predetermined ratio, a white color significantly varies for each product. Thus, after the assembly of the LCD module, color adjustment is performed on each product by a semifixed resistor 20.

The blue-green LED 18 and the red LED 22 have different temperature characteristics. Therefore, color variation due to temperature is corrected by a thermistor (temperature-sensitive resistor) 21. To be specific, in view of the fact that a resistance value of the thermistor 21 changes based on temperature, the thermistor 21 is selected so as to flow a current closer to an optimum current into the red LED 22.

A value of current flowing through the blue-green LED 18 is constantly detected using a current detecting resistor 17. A value of current flowing through the red LED 22 is controlled corresponding to the current value detected using the current detecting resistor 17. When the above-mentioned structure is used, it is unnecessary to convert an intensity adjustment signal for logic from a CPU of an application on which a display device is mounted into an analog signal, so a simple circuit structure can be realized.

As described above, the liquid crystal display device according to the present invention has the high intensity and the high color reproducibility region. Therefore, the color rendering property of a display image is improved and the white balance can be adjusted based on the current values.

What is claimed is:

1. A display device comprising:
    a red light emitting diode package including a red LED element that emits a red light;
    a blue LED element that emits a blue light;
    phosphor particles for converting the blue light into a green light having a peak wavelength in a green spectral region;
    a blue-green light emitting diode package including the blue LED element potted in a resin in which the phosphor particles are dispersed;
    a display element of a non-self light emission type having a color filter, the display element being illuminated by the blue light, the green light and the red light; and
    a circuit for controlling light emission intensities of the red LED element and the blue LED element so that the display device exhibits a preferable color balance.

2. A display device according to claim 1; wherein the blue LED element is made of material of one of InGaN and GaN; the red LED element is made of a material selected from the group consisting of GaP, GaAlAs, and AlGaInP; and the phosphor particles are selected from the group consisting of at least one of $SrGa_2S_4$:Eu, $Ca_3Sc_2Si_3O_{12}$:Ce, and Sr-SION:Eu.

3. A display device according to claim 2; wherein the resin is a non-permeable material.

4. A display device according to claim 3; wherein the non-permeable material comprises at least one selected from the group consisting of silicon resin, cycloolefin resin, fluorine resin, and epoxy resin.

5. A display device according to claim 1; wherein the circuit comprises a driver circuit for the red LED element and a driver circuit for the blue LED element; and the driver circuit for the red LED element includes a temperature-sensitive resistor.

6. A display device according to claim 1 wherein the circuit comprises a driver circuit for the red LED element and a driver circuit for the blue LED element; and the driver circuit for the blue LED element includes a current detecting resistor.

7. An illumination device comprising:
a blue LED element that emits a blue light;
phosphor particles for converting the blue light into a green light having a peak wavelength in a green spectral region;
a blue-green light emitting diode package including the blue LED element potted in a resin in which the phosphor particles are dispersed;
a red light emitting diode package including a red LED element that emits a red light; and
a circuit for controlling light emission intensities of the red LED element and the blue LED element so that the illumination device provides illuminating light that has a preferable color balance.

8. An illumination device according to claim 7; wherein the blue LED element is made of a material of one of InGaN and GaN.

9. An illumination device according to claim 7; wherein the phosphor particles are selected from the group consisting of at least one of $SrGa_2S_4$:Eu, $Ca_3Sc_2Si_3O_{12}$:Ce, and Sr-SION: Eu.

10. An illumination device according to claim 7; wherein the red LED element is made of a material selected from the group consisting of GaP, GaAlAs, and AlGaInP.

11. An illumination device according to claim 7; wherein the resin comprises a non-permeable material.

12. An illumination device according to claim 7; wherein the non-permeable material comprises at least one selected from the group consisting of silicon resin, cycloolefin resin, fluorine resin, and epoxy resin.

13. An illumination device according to claim 7; wherein the circuit comprises a driver circuit for the red LED element and a driver circuit for the blue LED element; and the driver circuit for the red LED element includes a temperature-sensitive resistor.

14. An illumination device according to claim 7; wherein the circuit comprises a driver circuit for the red LED element and a driver circuit for the blue LED element; and the driver circuit for the blue LED element includes a current detecting resistor.

15. An illumination device comprising: a red light-emitting diode package having a red LED element that emits red light; a blue-green light-emitting diode package having a blue LED element that emits blue light and that is encapsulated in a resin in which are dispersed particles that transform the blue light into green light having a peak wavelength in a green spectral region; a light guide member that receives and mixes the red light, the blue light and the green light to obtain white light which exits from a light exit surface of the light guide member as illuminating light; and a circuit that controls the light emission intensities of the packaged red LED element and the packaged blue LED element to thereby control the color balance of the illuminating light.

16. An illuminating device according to claim 15; wherein the circuit comprises a driver circuit that drives the red LED element and that includes a temperature-sensitive resistor, and a drive circuit that drives the blue LED element.

17. An illuminating device according to claim 16; wherein the driver circuit that drives the blue LED element includes a current detecting resistor.

18. An illuminating device according to claim 15; wherein the circuit comprises a driver circuit that drives the red LED element, and a driver circuit that drives the blue LED element and that includes a current detecting resistor.

19. An illuminating device according to claim 15; wherein the circuit includes a current detecting element that detects the current flowing through the blue LED element and controls the current flowing through the red LED element based on the detected current value.

20. An illuminating device according to claim 15; wherein the circuit includes means for selectively adjusting the current value ratio of the current flowing through the blue LED element to the current flowing through the red LED element.

* * * * *